(12) United States Patent
Vinciarelli et al.

(10) Patent No.: US 7,038,917 B2
(45) Date of Patent: May 2, 2006

(54) LOW LOSS, HIGH DENSITY ARRAY INTERCONNECTION

(75) Inventors: Patrizio Vinciarelli, Boston, MA (US); Charles I. McCauley, Andover, MA (US); Paul V. Starenas, Windham, NH (US)

(73) Assignee: VLT, Inc., Sunnyvale, CA (US)

( * ) Notice: Subject to any disclaimer, the term of this patent is extended or adjusted under 35 U.S.C. 154(b) by 302 days.

(21) Appl. No.: 10/331,032

(22) Filed: Dec. 27, 2002

(65) Prior Publication Data

US 2004/0125577 A1    Jul. 1, 2004

(51) Int. Cl.
*H05K 1/18* (2006.01)

(52) U.S. Cl. .................... 361/778; 174/255

(58) Field of Classification Search ........... 174/250, 174/255, 260, 267; 257/202–209; 361/775–795
See application file for complete search history.

(56) References Cited

U.S. PATENT DOCUMENTS

| | | | |
|---|---|---|---|
| 4,630,357 A | 12/1986 | Rogers et al. | |
| 4,821,007 A | 4/1989 | Fields et al. | |
| 4,943,539 A | 7/1990 | Wilson et al. | |
| 5,070,391 A | 12/1991 | Liou et al. | |
| 5,148,263 A | 9/1992 | Hamai | |
| 5,158,910 A | 10/1992 | Cooper et al. | |
| 5,266,912 A * | 11/1993 | Kledzik | 333/247 |
| 5,306,938 A | 4/1994 | Shirai | |
| 5,365,082 A | 11/1994 | Gill et al. | |
| 5,391,517 A | 2/1995 | Gelatos et al. | |
| 5,412,239 A * | 5/1995 | Williams | 257/343 |
| 5,429,989 A | 7/1995 | Fiordalice et al. | |
| 5,442,235 A | 8/1995 | Parrillo et al. | |
| 5,476,817 A | 12/1995 | Numata | |
| 5,477,082 A | 12/1995 | Buckley, III et al. | |
| 5,527,739 A | 6/1996 | Parrillo et al. | |
| 5,578,841 A | 11/1996 | Vasquez et al. | |
| 5,612,566 A | 3/1997 | Williams | |
| 5,633,199 A | 5/1997 | Fiordalice et al. | |
| 5,640,049 A | 6/1997 | Rostoker et al. | |
| 5,677,239 A | 10/1997 | Isobe | |
| 5,710,451 A | 1/1998 | Merchant | |
| 5,710,455 A | 1/1998 | Bhatnagar et al. | |
| 5,731,732 A | 3/1998 | Williams | |
| 5,756,395 A | 5/1998 | Rostoker et al. | |
| 5,777,383 A | 7/1998 | Stager et al. | |
| 5,817,546 A | 10/1998 | Ferla et al. | |
| 5,844,275 A | 12/1998 | Kitamura et al. | |
| 5,847,466 A | 12/1998 | Ito et al. | |
| 5,856,636 A * | 1/1999 | Sanso | 174/255 |
| 5,856,913 A * | 1/1999 | Heilbronner | 361/760 |

(Continued)

*Primary Examiner*—Kamand Cuneo
*Assistant Examiner*—Yuriy Semenenko
(74) *Attorney, Agent, or Firm*—Fish & Richardson P.C.

(57) ABSTRACT

An interconnect architecture in which a substrate such as a printed circuit board includes multiple conductive layers separated by one or more interposed insulating layers, the conductive layers being adapted to receive a high density array of interconnect elements such as a ball grid array (BGA). In certain preferred embodiments, a printed circuit board may provide a very low resistance interconnect forming the drain and source terminals of a lateral power MOSFET device incorporating a high density array of alternating source and drain interconnect elements, such as a BGA. In such embodiments, source and drain currents may be routed on different conductive layers separated by one or more interposed insulating layers. The upper conductive layer may include laterally non-conductive regions accommodating conductive columns that are connected to the lower conductive layer.

35 Claims, 9 Drawing Sheets

U.S. PATENT DOCUMENTS

| | | | |
|---|---|---|---|
| 5,869,371 A | 2/1999 | Blanchard | |
| 5,898,217 A | 4/1999 | Johnston | |
| 5,903,469 A | 5/1999 | Ho | |
| 5,999,726 A | 12/1999 | Ho | |
| 6,005,271 A | 12/1999 | Hshich | |
| 6,046,473 A | 4/2000 | Blanchard | |
| 6,069,400 A | 5/2000 | Kimura et al. | |
| 6,075,293 A | 6/2000 | Li et al. | |
| 6,108,210 A * | 8/2000 | Chung | 361/747 |
| 6,121,554 A * | 9/2000 | Kamikawa | 174/260 |
| 6,124,627 A | 9/2000 | Rodder et al. | |
| 6,127,233 A | 10/2000 | Rodder | |
| 6,180,265 B1 | 1/2001 | Erickson | |
| 6,189,771 B1 | 2/2001 | Maeda et al. | |
| 6,193,143 B1 | 2/2001 | Ishikawa | |
| 6,228,719 B1 | 5/2001 | Frisina et al. | |
| 6,239,491 B1 | 5/2001 | Pasch et al. | |
| 6,246,091 B1 | 6/2001 | Rodder | |
| 6,251,501 B1 | 6/2001 | Higdon et al. | |
| 6,251,736 B1 | 6/2001 | Brambilla et al. | |
| 6,251,740 B1 | 6/2001 | Johnson et al. | |
| 6,273,328 B1 | 8/2001 | Maeda et al. | |
| 6,277,728 B1 | 8/2001 | Ahn et al. | |
| 6,278,264 B1 | 8/2001 | Burstein et al. | |
| 6,313,007 B1 | 11/2001 | Ma et al. | |
| 6,319,780 B1 | 11/2001 | Crivelli et al. | |
| 6,319,844 B1 | 11/2001 | Usami et al. | |
| 6,331,447 B1 | 12/2001 | Ho | |
| 6,332,569 B1 | 12/2001 | Cordes et al. | |
| 6,350,637 B1 | 2/2002 | Maurelli et al. | |
| 6,358,837 B1 | 3/2002 | Miller et al. | |
| 6,373,100 B1 | 4/2002 | Pages et al. | |
| 6,379,159 B1 | 4/2002 | Mune et al. | |
| 6,392,290 B1 | 5/2002 | Kasem et al. | |
| 6,392,428 B1 | 5/2002 | Kline et al. | |
| 6,395,629 B1 | 5/2002 | Sidhwa et al. | |
| 6,404,010 B1 | 6/2002 | Saggio et al. | |
| 6,410,379 B1 | 6/2002 | Wahlstrom | |
| 6,411,160 B1 | 6/2002 | Riho et al. | |
| 6,417,575 B1 | 7/2002 | Harada et al. | |
| 6,423,623 B1 | 7/2002 | Bencuya et al. | |
| 6,429,113 B1 | 8/2002 | Lewis et al. | |
| 6,479,758 B1 | 11/2002 | Arima et al. | |
| 6,521,842 B1 * | 2/2003 | Brinthaupt et al. | 174/252 |
| 6,747,216 B1 * | 6/2004 | Brist et al. | 174/262 |
| 6,787,710 B1 * | 9/2004 | Uematsu et al. | 174/261 |
| 2001/0045635 A1 | 11/2001 | Kinzer et al. | |
| 2002/0105009 A1 | 8/2002 | Eden et al. | |

* cited by examiner

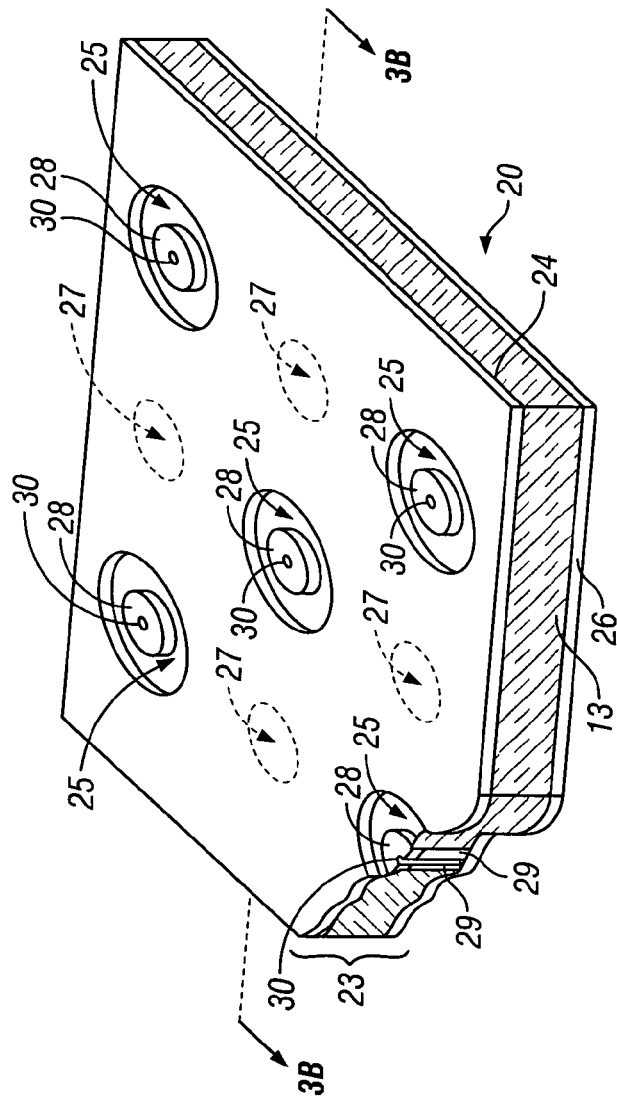
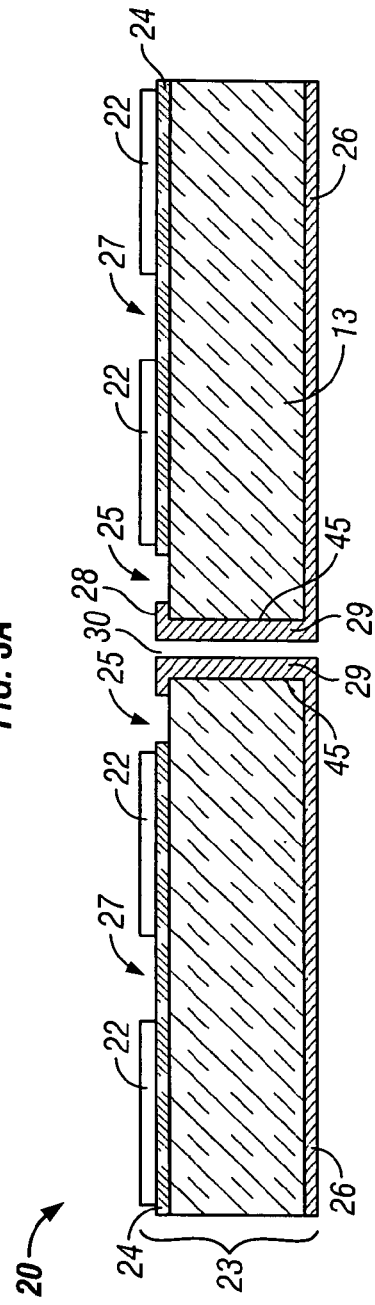
FIG. 3A
FIG. 3B

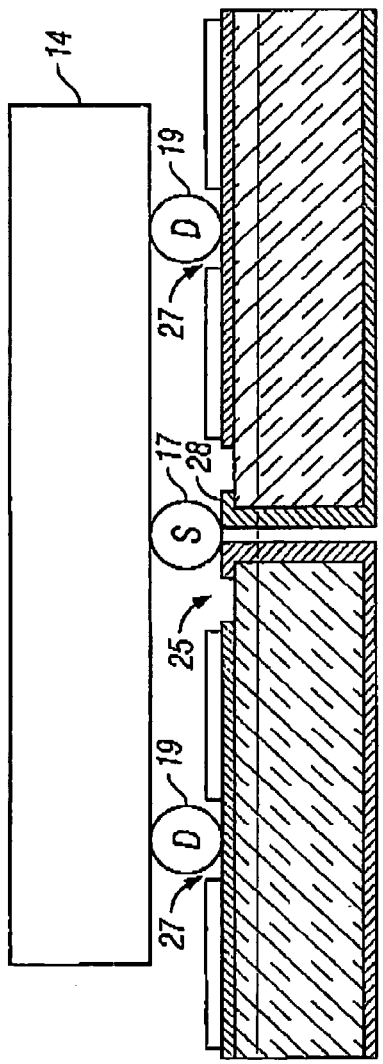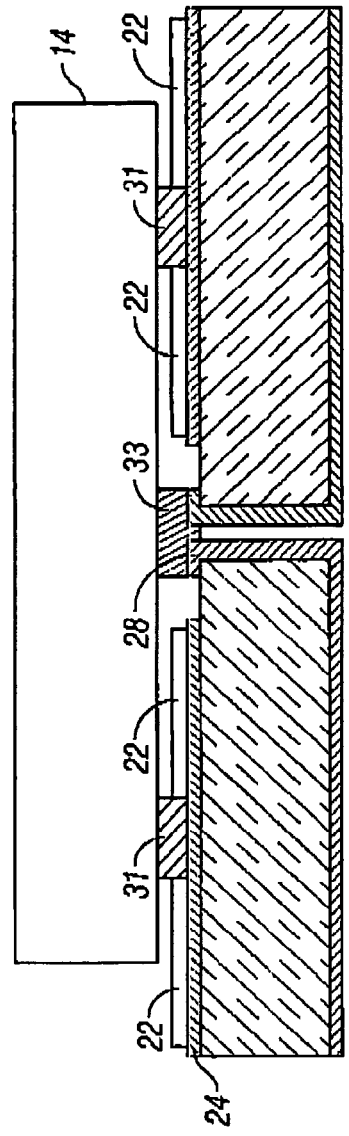

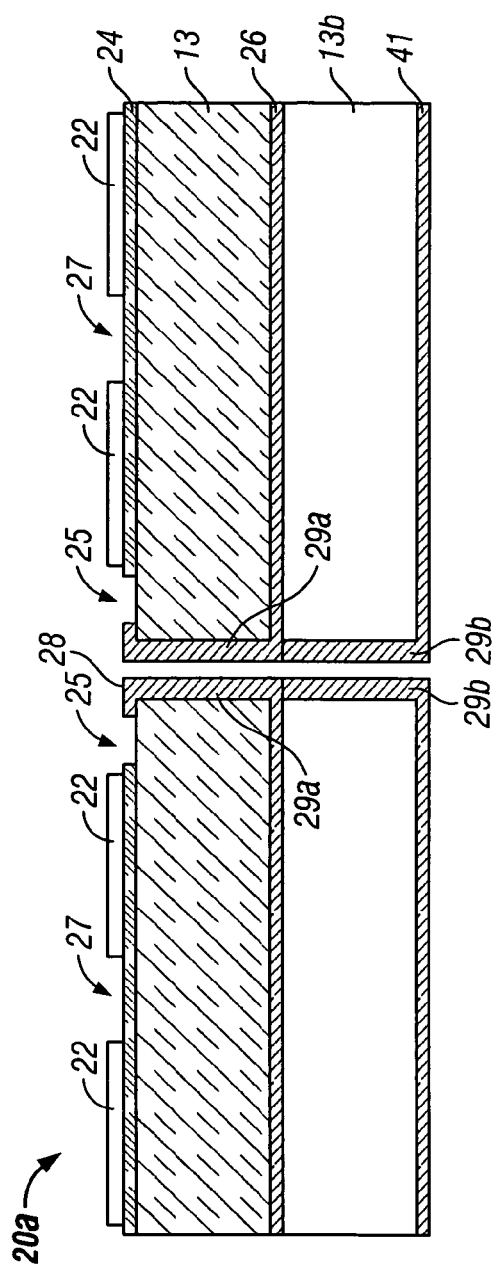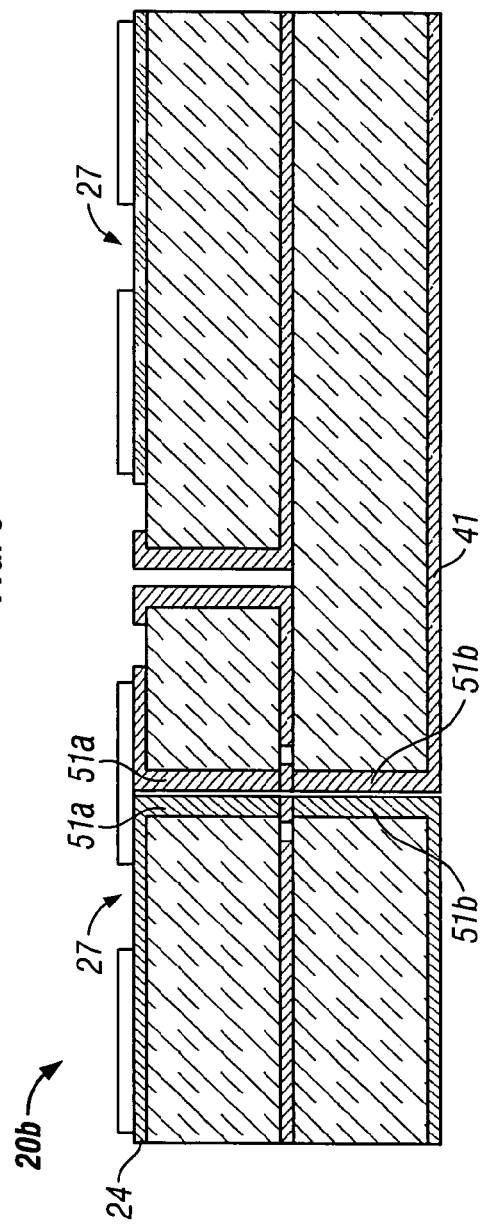

US 7,038,917 B2

LOW LOSS, HIGH DENSITY ARRAY INTERCONNECTION

TECHNICAL FIELD

This invention relates to interconnection of electronic devices such as integrated circuits and printed circuit boards.

BACKGROUND

Electronic assemblies typically comprise a plurality of components, such as semiconductor integrated circuits, including MOSFET power transistors, mounted to a substrate such as a printed circuit board (PCB) or ceramic plate. The substrate can include patterns of conductive elements (e.g., pads, traces, and/or planes) to interconnect the substrate to the components in a predetermined way. There are a variety of ways to create interconnections between the conductive terminations on the components and the conductive elements on a substrate. For example, a semiconductor die can be wire-bonded to a lead-frame and over-molded in a package having a standardized footprint. The lead-frame can include a number of conductive leads that are soldered to pads on the surface of the substrate. Conventional examples of such embodiments include integrated circuits in dual-in-line ("DIP") and small-outline ("SO") packages. In such packages, the overall volume of the packaged device is usually significantly greater than the volume of the semiconductor die within the package. For power devices, e.g., low voltage MOSFET power transistors, such packages typically exhibit significant lead interconnect resistance and inductance.

Semiconductor components may also be mounted directly to the substrate. One way to do this, shown in FIGS. 1A and 1B, is to directly connect conductive pads (e.g., pads 10a, 10b, 10c) on the surface of the substrate 12 to interconnection pads (not shown) on the surface of a semiconductor die 14 by use of area array interconnects (e.g., ball-grid array interconnects 16a, 16b, and 16c). The area array interconnects may be made, e.g., of solder or conductive epoxy. Stud bumps may also be used. The assembly method shown in FIG. 1 is sometimes referred to as a "flip-chip" assembly.

For some semiconductor components, a plurality of interconnections on the surface of a die are are made to form a component termination. An example of such a component is a power MOSFET, which can include a plurality (in some cases, many thousands) of active cells, each cell comprising a drain, source and gate termination. The drain terminal of the component can be formed by connecting essentially all of the drain terminals of the active cells together. Likewise, the source and gate terminals can be formed by connecting essentially all of the source and gate terminals of the active cells together.

FIG. 13A shows an example of a vertical DMOS power MOSFET die 200 comprising a ball-grid array of interconnects. A vertical MOSFET comprises a plurality of active cells that carry current vertically within a die (as indicated by the arrow in the Figure labeled "current flow"). A first surface of the die can include a plurality of drain contacts and a second surface comprises a plurality of source and gate contacts. The plurality of low power gate contacts are connected together by metallization (not shown) on the second surface of the die and brought out to a ball-grid gate interconnect contact, e.g., interconnect 205 in FIG. 13A. Individual source contacts are also brought out to an array of ball-grid source interconnects 204 on the second surface of the die 200. The array of drain contacts on the first surface of the die are connected together by a sheet of drain contact metallization 202. One way to package such a device is shown in FIG. 13B. In the Figure, the drain contact metallization 202 is connected (e.g., by solder, not shown) to a conductive frame 206. Ball grid contacts, such as source interconnects 204 on the die 200 and drain interconnects 207 on the frame, extend from the bottom of the assembly comprising the die and the frame. As shown in FIG. 14, the device of FIG. 13B may be mounted to a printed circuit board 209 by connecting the drain interconnects 207 and the source interconnects 204 to drain etch planes 211 and source etch plane 213 on the surface of the board 209 (the gate interconnect is not shown). Fairchild Semiconductor Corporation, South Portland, Me., U.S.A., manufactures a device of the kind shown in FIG. 13A, as part number FDZ201N, "N-channel 2.5 V Specified Power Trench BGA MOSFET."

Lateral power MOSFET devices are also known. Such devices can include a plurality of active cells comprising drain, source, and gate terminals that are connected in parallel. However, unlike the vertical MOSFET discussed above, the current in the cells of a lateral MOSFET flows horizontally within the die. Thus, all of the gate, source, and drain contacts can reside on the same surface of the die. The packaging and mounting techniques shown in FIGS. 13 and 14 are not adapted for use with such a lateral device, particularly in cases where the source and drain contacts are disposed on the same side of the die.

Lateral power MOSFET devices may provide an effective channel ON state resistance lower than 1000 micro-Ohm within a die measuring 3 mm×3 mm. Owing to the relatively high resistance per square of thin metal interconnect layers available on silicon, proximity of source and drain terminals to all active cells within the die is required to achieve comparably low values of effective device ON state resistance. By distributing across the mounting surface of the die a set of interconnect elements, including a subset of drain interconnect elements and a subset of source interconnect elements with alternating source and drain elements, such as with a high density ball grid array (BGA) having a source and drain ball pitch of 0.5 mm or less, low values of effective device ON state resistance may be retained. However, to take full advantage of the low loss capability of such a device, a substrate or printed circuit board providing a low loss, high density array interconnection is required. The interconnect architecture should achieve a substrate interconnect resistance substantially lower than 500 micro-Ohm to adequately support a lateral power MOSFET device having a 1000 micro-Ohm ON state resistance.

One way to interconnect a plurality of connections disposed on the same side of a die is described with respect to a voltage regulator integrated circuit in Burstein et al., U.S. Pat. No. 6,278,264, "Flip-Chip Switching Regulator." The method generally consists of arranging individual interconnections on the die so that the ball-grid array forms rows of source and drain connections that are generally parallel to the edges of the die. Linear rows of balls connected to MOSFET drains alternate with generally linear rows of balls connected to MOSFET sources. The substrate onto which the balls are placed comprises interdigitated fingers of conductive etch on the top side of the substrate. The interdigitated fingers of conductive etch connect the alternating rows together so as to create a conductive region on the top side of the substrate that connects together all of the MOSFET sources and another conductive region on the top side which connects together all of the MOSFET drains. However, due, in part, to the resistance per square of copper that may be etched with the required line spacing resolution, the interconnect architecture outlined above gives rise to a high substrate interconnect resistance and losses higher than the acceptable limit specified above.

SUMMARY

An interconnect architecture in which a substrate such as a printed circuit board includes multiple conductive layers separated by one or more interposed insulating layers, the conductive layers being adapted to receive a high density array of interconnect elements such as a BGA. In certain preferred embodiments, a printed circuit board may provide a very low resistance interconnect forming the drain and source terminals of a lateral power MOSFET device incorporating a high density array of alternating source and drain interconnect elements, such as a BGA. In such embodiments, source and drain currents may be routed on different conductive layers separated by one or more interposed insulating layers. The upper conductive layer may include laterally non-conductive regions accommodating conductive columns conforming to the locations of a subset of the interconnect elements, the subset being associated with either the drain terminal or source terminal, and passing through the insulating layer to connect a lower conductive layer to the interconnect elements of that subset. The aggregate interconnect resistance in such embodiments, including connections from the multiplicity of source and drain balls under the FET to a conductive edge along the periphery of the FET die, may be 200 micro-Ohm or lower.

DESCRIPTION OF DRAWINGS

We first briefly describe the drawings:

FIG. 3A is a perspective view of a substrate, partially cut away, viewed from the top.

FIG. 3B is a cross-section of the substrate along the line A—A in FIG. 3A.

FIGS. 4A and 4B show cross-sectional views of a semiconductor device having a solder ball-grid array of interconnections mounted on a substrate before and after solder reflow, respectively.

FIGS. 8 and 9 show cross-sectional views of substrates.

Like reference symbols in the various drawings indicate like elements.

DETAILED DESCRIPTION OF ILLUSTRATIVE EMBODIMENTS

Figure 1A:
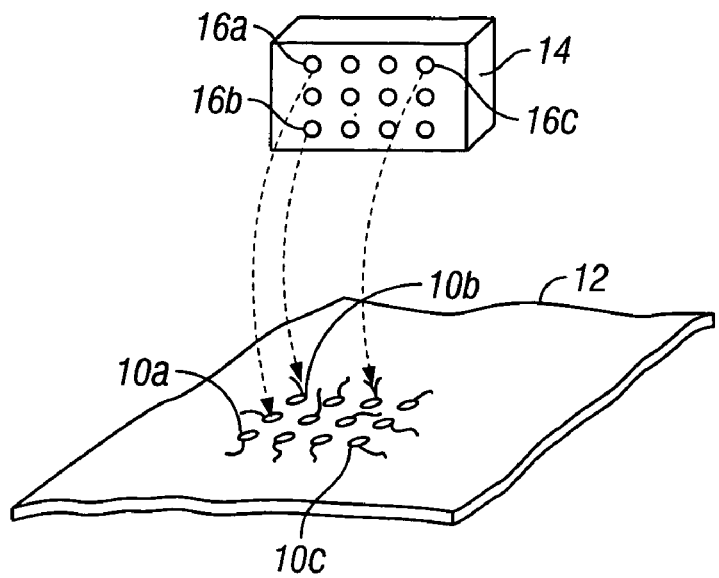
FIGS. 1A and 1B show, respectively, an exploded perspective view and a perspective view of a flip-chip assembly.
Figure 1B:
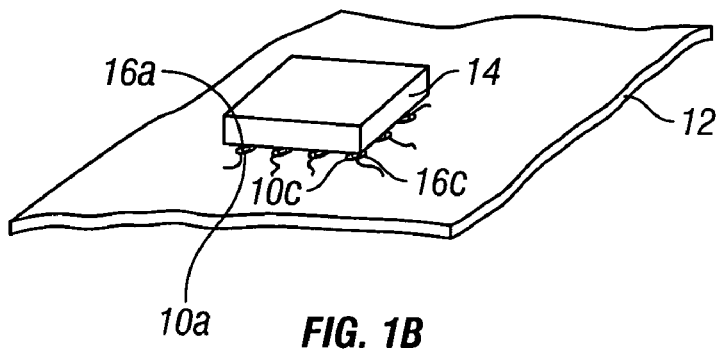
Figure 2:
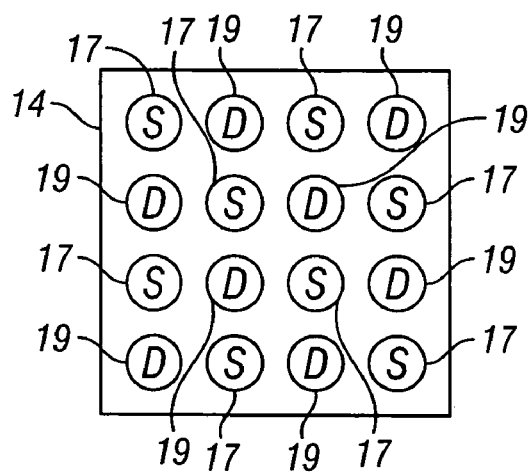
FIG. 2 shows an arrangement of interconnections on a semiconductor device.

FIGS. 2 shows a surface of a semiconductor die 14 having ball-grid contacts 17 and 19. The semiconductor die 14 is of the kind for which a first termination to the die requires that low resistance connections be made to a first subset of balls on a surface of the die; a second termination to the die requires that low resistance connections be made to a second subset of balls on the same surface of the die; and the balls that form the first termination are arranged in a pattern which alternates with the pattern of the balls which form the second termination. The example shown in FIG. 2 is a lateral MOSFET. In FIG. 2 the source solder balls 17 and the drain balls 19 are on the same surface of the die and alternate within rows and columns that are generally parallel to the edges of the die 14. The source and drain balls 17 and 19 form an alternating pattern in which the interconnect pattern for the source termination and the interconnect pattern for a drain termination differ only in terms of spatial offset or angular rotation. The die 14 might also include additional terminations. For example, the semiconductor die 14 may contain a MOSFET switch, as well as other circuitry. The terminations on such a die might include the source and drain terminals for the MOSFET as well as one or more power and ground terminals for the other circuitry. In such an example, balls comprising more than two terminations (e.g., source, drain, power, ground) might alternate within a region, or different regions, of the die.

In embodiments wherein linear rows of balls connected to MOSFET drains alternate with generally linear rows of balls connected to MOSFET sources, the pitch of the source balls 17 and the pitch of the drain balls 19 is the same. In the arrangement shown in FIG. 2, however, the pitch between the source balls 17 is increased by a factor of $\sqrt{2}$ (square root of 2). Similarly, the pitch of the drain balls 19 is increased by $\sqrt{2}$. In other embodiments wherein the source and drain solder balls 17 and 19 are not in an aligned checkerboard pattern, the respective pitches of the source and drain solder balls 17 and 19 can be increased by a factor of about 1.1 or more.

Low voltage lateral MOSFET switching power devices can achieve lower values of ON resistance than can be achieved with certain vertical MOSFET devices. However, unlike a vertical MOSFET in which the source and drain connections typically come out of opposite surfaces of the die, all of the connections to a lateral MOSFET are typically on one surface of the die. Furthermore, a low ON resistance lateral MOSFET typically includes an array of interconnect elements to provide source and drain connections in relative proximity to the MOSFET cells. To fully exploit the potential for low in-circuit resistance of the lateral MOSFET, the aggregate resistance of the interconnections between the lateral MOSFET and the substrate to which it is mounted may be made very low.

A portion of a substrate 20 for achieving efficient termination of the die 14 of FIG. 2 is illustrated in FIGS. 3A and 3B. In FIGS. 3A and 3B, the substrate 20 comprises a two-layer printed circuit board 23 with a top conductive layer 24, a bottom conductive layer 26, and a non-conductive core 13. A non-conductive solder mask 22 (shown in FIG. 3B) on the top of the substrate 20 is cleared away in regions 27 to form "solder-mask-defined" locations for connection to, e.g., drain solder balls 19 on the die 14 shown in FIG. 2. The solder mask 22 is also cleared away in regions 25 to create mask-free regions around pads 28. The solder mask can be configured to cover the exposed edges of the conductive layer 27 that are exposed at regions 25. Pads 28 form "pad-defined" locations for connection to, e.g., source solder balls 17 on the die 14 of FIG. 2. Pad 28 connects to column 29, which is plated onto the inside surface of a hole 45 (shown in FIG. 3B) in the core 13 to connect pad 28 to bottom conductive layer 26. By laser drilling the hole 45, both the diameter of the column 29 and the size of the through hole 30 may be kept small.

FIGS. 4A and 4B show, respectively, partial cross-sectional views of a die of the kind shown in FIG. 3A mounted to a substrate of the kind shown in FIG. 2, before and after reflowing the solder balls 17 and 19. In FIG. 4A, drain solder balls 19 lie in solder-mask-defined regions 27 and source solder balls 17 lie in pad-defined regions 25. In FIG. 4B, the solder balls 17 and 19 have been reflowed to form soldered drain connections 31 and soldered source connections 33 between the die 14 and the top conductive layer 24. In certain embodiments, the solder will wet only to the exposed pad, and will not wet to the exposed non-conductive core 13.

Figure 5:
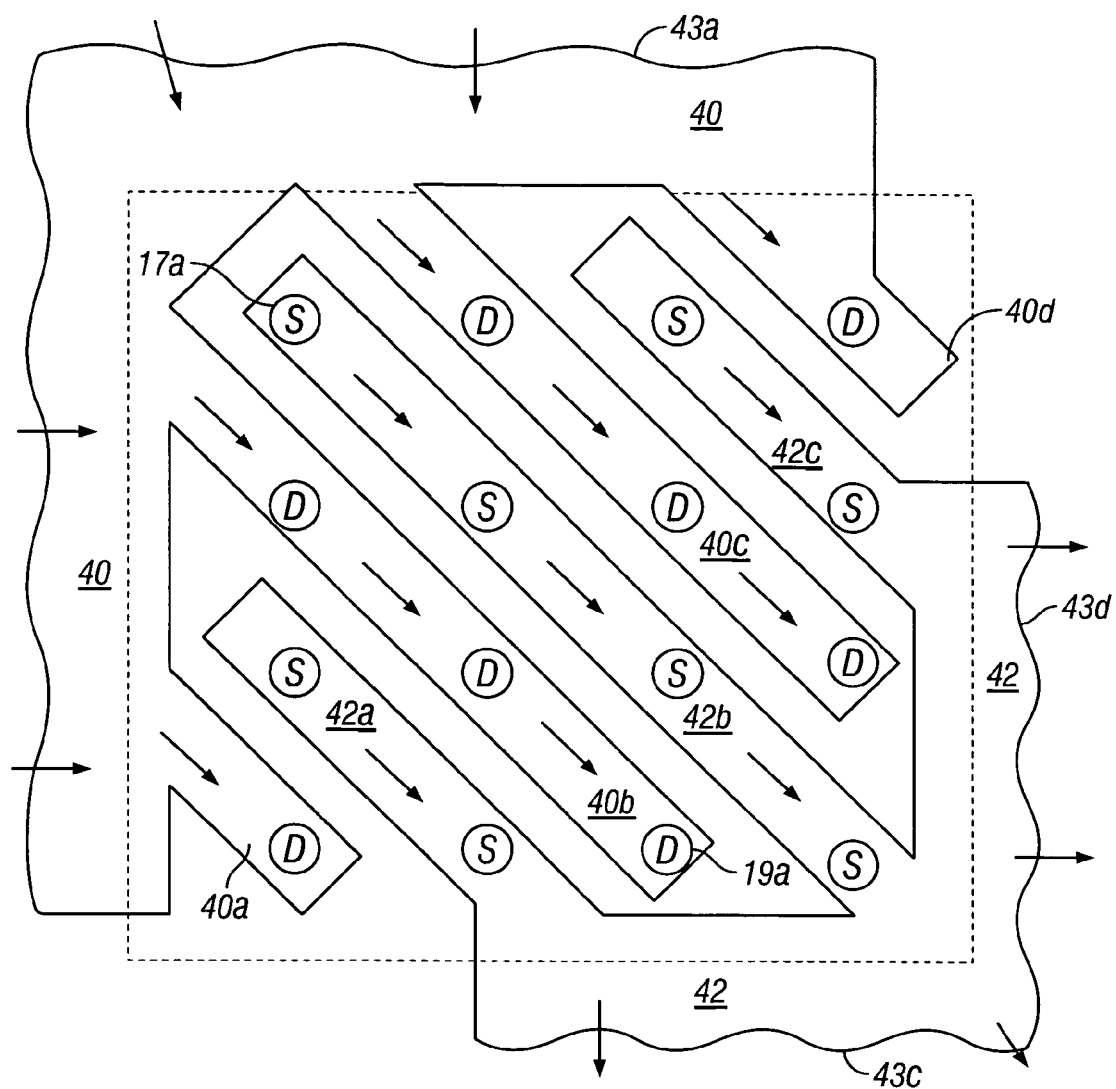
FIG. 5 shows currents flowing in an arrangement of source and drain metal traces on a patterned die.
Figure 6:
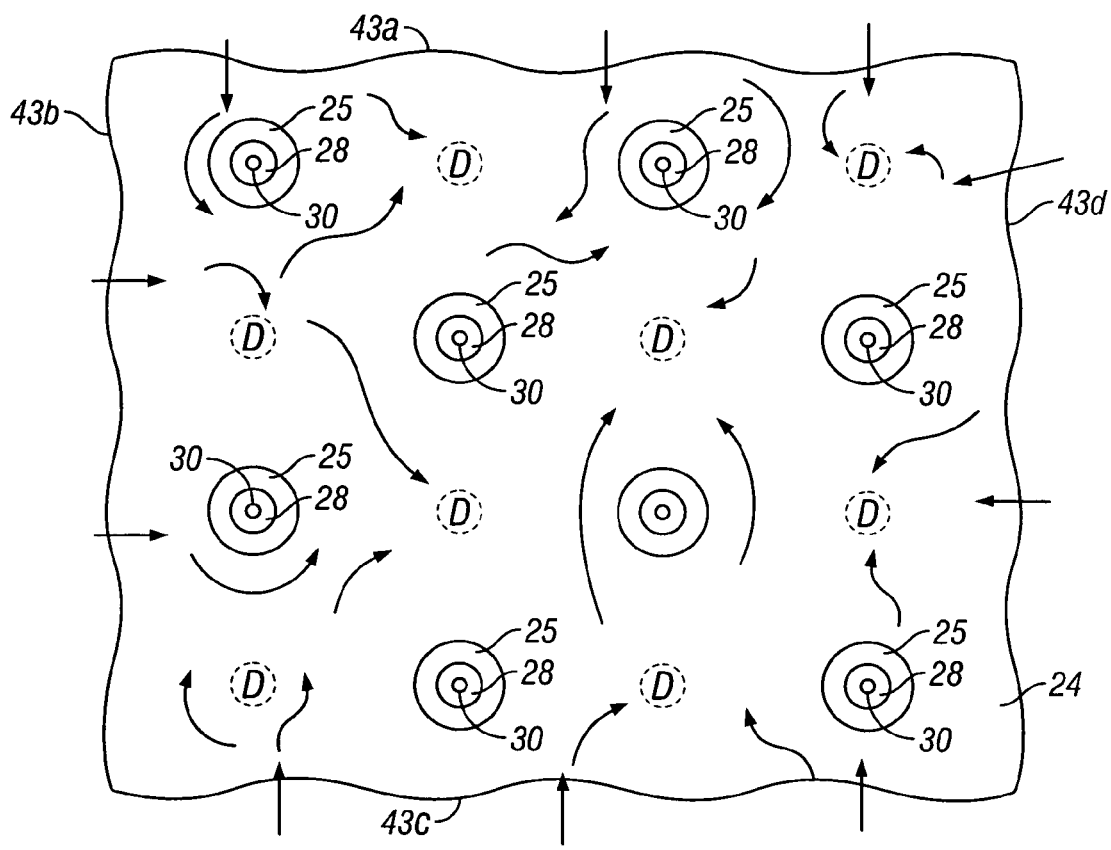
FIG. 6 shows current flowing through etches on a printed circuit board.

FIG. 5 shows the top conductive layer of a printed circuit board with an interdigitated termination etch architecture. FIG. 6 shows the top conductive layer of a printed circuit board using the termination etch arrangement (as described above with reference to FIGS. 3 and 4). The pattern of conductive elements is arranged in each of FIGS. 5 and 6 to terminate the source and drain connections of a MOSFET die of the kind shown in FIG. 2. In FIG. 5, the locations of the drain solder ball connections are indicated by the circles marked "D" and the locations of the source solder ball connections are indicated by the circles marked "S." In FIG. 6, the locations of the drain solder ball connections are indicated by the circles marked "D" and the source solder balls are connected to source pads 28.

In FIG. 5, the drain termination etch 40, comprising drain etch fingers 40a–40d is interdigitated with the source termination etch 42, comprising source etch fingers 42a–42c. Current that flows into the drain termination etch 40 flows out of the source termination etch 42, as indicated by the arrows in FIG. 5. Current is constrained to flow along the paths defined by the etch fingers, which results in voltage drops along the length of the etch fingers 40 and 42. Furthermore, because both the drain and source termination etches 40 and 42 are on one side of the circuit board, a portion of the periphery of the interconnection etch pattern must be reserved to carry the flow of drain current into the die (i.e., peripheral etch regions 43a and 43b) and the remainder of the periphery must be reserved for source current to flow out of the die (i.e., peripheral etch regions 43c and 43d). Because the currents in the source and drain are essentially identical, losses will be minimized if half of the periphery is reserved for the source current and the other half for the drain current.

With the interconnect architecture of FIG. 6, essentially all of the top conductive layer 24 is available to carry current into the drain solder ball connections, with the exception being the laterally non-conductive regions 25 that surround the source solder ball pads 28. Furthermore, the etch pattern of FIG. 6 allows current to efficiently flow into the drain from three or four of the peripheral etch regions 43a–43d. In contrast, no more than two of the peripheral etch regions could be utilized to efficiently carry current into the drain in the etch pattern shown in FIG. 5. Because current may flow into the drain connections from all around the periphery and because the flow of current is not constrained to follow paths with substantial resistance, as it is in the arrangement of FIG. 5, but can flow into any of the drain connection from any direction, the overall resistance between external circuitry and the drain contacts will be relatively lower for the architecture of FIG. 6 and the voltage drop between drain pads will be less. The same applies to the source connections because, as discussed above, essentially the entire bottom conductive layer 26 is dedicated to the flow of source current.

Figure 7:
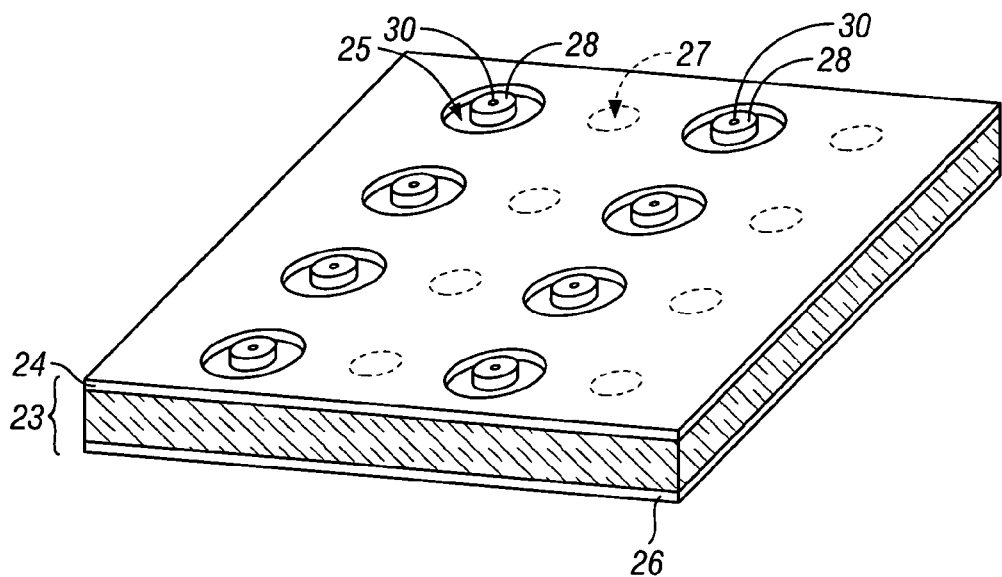
FIG. 7 shows a perspective view of a substrate.

The architecture of FIG. 6 can be applied to a semiconductor die in which the ball grid of contacts are arranged in alternating rows of like kinds. As shown in FIG. 7, a substrate for such a device would use the same basic structural arrangement of the substrate 20 of FIG. 3A. Differences may include, for example, the relative locations of the regions 27 which form the "solder-mask-defined" locations for connection to, e.g., the drain solder balls 19 and the locations of the pads 28 for connection, e.g., to the source solder balls 17 and their respective cleared-away regions 25.

For ball grid arrays of the same dimensions and substrates having cleared-away regions 25 of the same size, the interconnect structure of FIG. 3A (which is compatible with MOSFET embodiments wherein the source balls and the drain balls alternate within rows and columns that are generally parallel to the edges of the die) may exhibit a lower overall resistance than the interconnect structure of FIG. 7 (which is compatible with MOSFET embodiments wherein linear rows of balls connected to MOSFET drains alternate with linear rows of balls connected to MOSFET sources), owing to the larger spacing between regions 25 on the surface of the substrate. This larger spacing is due to the regions 25 being located along diagonals in the array of FIG. 3A as opposed to being arranged along a row or column, as shown in FIG. 7. Thus, the distance between the center of source interconnect elements in FIG. 3A is approximately $\sqrt{2}$ greater than the distance between the center of interconnect elements of source interconnect elements in FIG. 7. As the pitch of the non-conductive regions 25 is made finer and approaches the diameter of the laterally non-conductive regions 25, current flow in between laterally non-conductive regions is pinched off. This pinch off effect causes the interconnect structure of FIG. 7 to exhibit higher interconnect resistance than the interconnect structure of FIG. 3A for a high density BGA.

A substantial reduction in interconnect resistance relative to the interconnect architecture of FIG. 5 requires a minimum number of rows and columns of interconnect elements. Furthermore, the reduction in interconnect loss grows rapidly with the size of the array. Specifically, with only two rows and two columns of interconnect elements, there are a total of four interconnect elements. The ON state resistance of MOSFET devices having only four interconnect elements is relatively high and may constitute the limiting factor to the total in-circuit ON state resistance. In order to achieve low values of effective device ON state resistance, ball grid arrays including three or more rows and columns of interconnect elements may be used Preferably, the MOSFET BGA may include at least five rows and five columns of interconnect elements to provide very low ON state resistance of the MOSFET device, i.e., 1000 micro-Ohm or less. In such embodiments, it is particularly advantageous to implement the low loss, high density array interconnections described herein in order to maintain low in-circuit ON state resistance.

The invention is not limited to use with substrates having two conductive layers. Rather, there are a many possible variations of arrangements of layers and columns that can be used to modify and augment the two-layer structures described above. For example, FIG. 8 shows a substrate 20a, such as a printed circuit board, having three layers of conductive etch 24, 26, and 41. All of the numbered features 22, 24, 25, 27, and 28 on the top surface of the substrate are as described previously for the substrate 20 of FIG. 3. However, the substrate of FIG. 8 has an additional insulating core 13b and an additional conductive layer 41. The additional conductive layer 41 is connected by means of columns 29a and additional columns 29b to conductive layer 26 and to pads 28. In another example, shown in FIG. 9, additional columns 51a and 51b are used to connect the top conductive layer 24 to the additional bottom conductive layer 41. Columns 51a and 51b may be located under the exposed region 27 that forms the "solder-mask-defined" location to form a "via-in-pad" construction.

Figure 10:
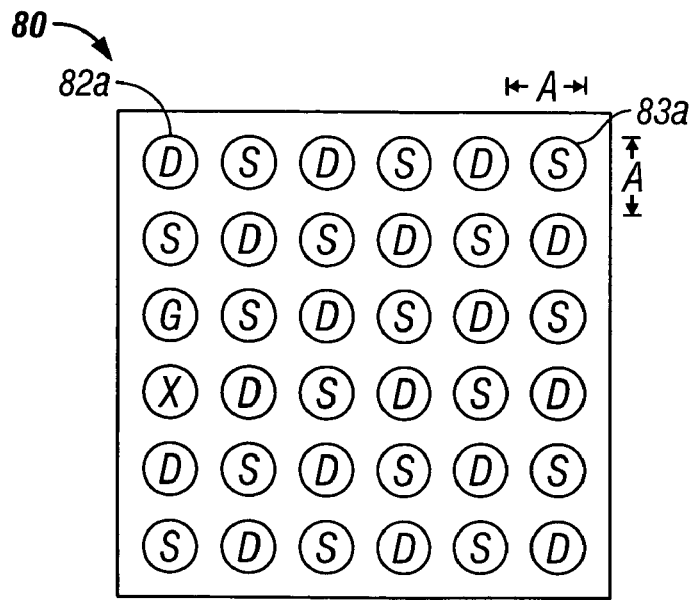
FIG. 10 shows a bottom view of a semiconductor device having interconnects thereon.
Figure 11:
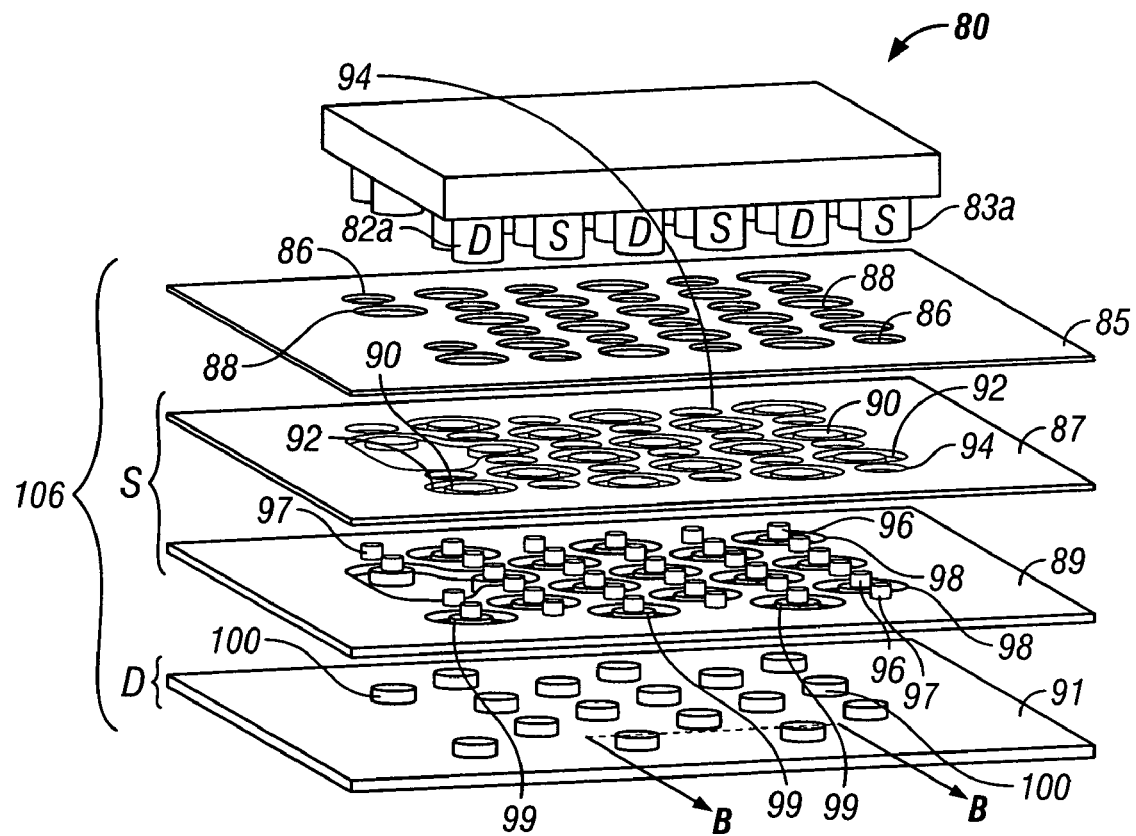
FIG. 11 shows an exploded perspective view of an assembly comprising a MOSFET device and a circuit board.
Figure 12:
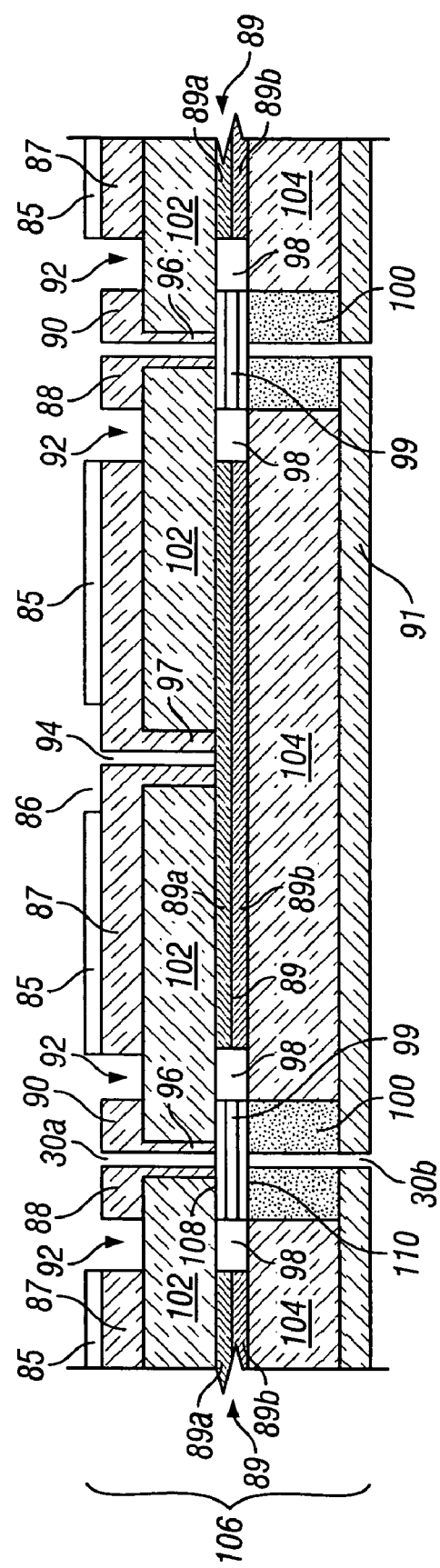
FIG. 12 shows a partial cross-section of the circuit board of FIG. 11.
Figure 13A:
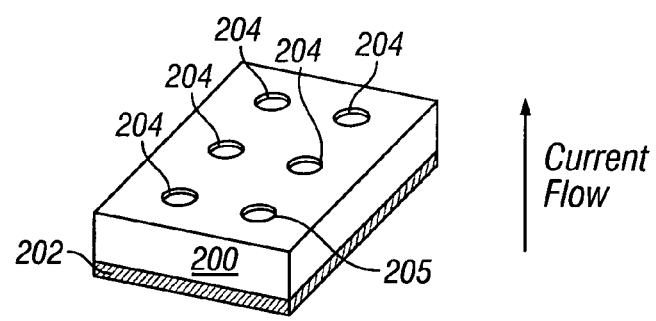
FIGS. 13A and 13B show, respectively, a perspective view of a vertical MOSFET die and a side view of the die contained within a package.
Figure 13B:
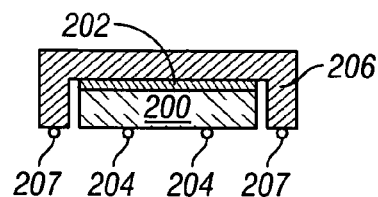
Figure 14:
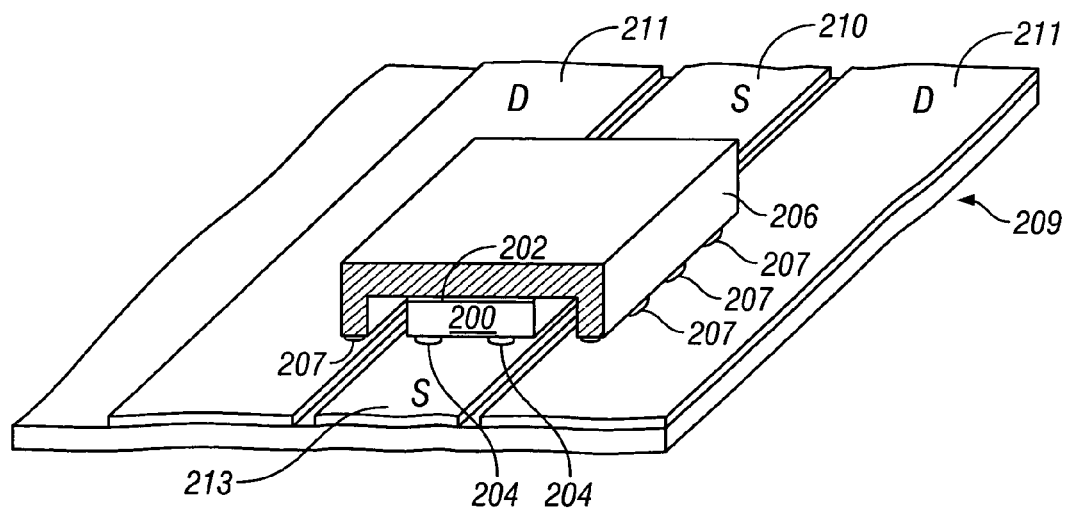
FIG. 14 shows a perspective view of the packaged die of FIG. 13B mounted to a substrate.

FIGS. 10, 11 and 12 illustrate an example of a preferred embodiment. FIG. 10 shows a bottom view of a MOSFET device 80 having a generally square array of thirty-six (36) interconnect elements, comprising seventeen (17) drain interconnect elements (labeled "D" in the drawing) and seventeen (17) source interconnect elements (labeled "S" in the drawing). One interconnect element, labeled "G" in FIG. 10, is a common gate connection; another interconnection element, labeled "X" in FIG. 10, is a drain cell connection within the MOSFET as is known in the art. The interconnect elements, D, S, G and X are fusible solder balls (e.g., eutectic tin-lead solder balls, 0.0146 inch (0.37 mm) in diameter) which are spaced apart on a 0.5 mm pitch (i.e., the dimensions labeled "A" in the drawing). The drain and source connections are arranged in an alternating pattern of the kind shown in FIG. 2, in which the source balls (S, FIG. 10) and the drain balls (D, FIG. 10) alternate within rows and columns that are generally parallel to the edges of the die.

FIG. 11 is an exploded view showing the spatial relationships between a flip-chip assembly comprising a MOSFET device 80 and a printed circuit board 106 onto which the MOSFET device is mounted. The MOSFET device 80 is of the kind shown in FIG. 10. As a spatial reference, the drain and source solder balls 82a and 83a, shown in the top corners in FIG. 10, appear in the front row of contacts in the view of the MOSFET device 80 in FIG. 11. As shown in FIGS. 11 and 12, the printed circuit board 106 comprises three layers of copper etch: a bottom layer 91, nominally 0.0028 inch (0.071 mm) thick; a middle layer 89, nominally 0.0022 inch (0.056 mm) thick; and a top layer 87, nominally 0.0018 inch (0.046 mm) thick. As shown in FIG. 12 (but not shown in FIG. 11), the top layer 87 and the middle layer 89 are separated by an insulating core 102, and the middle layer 89 and the bottom layer 91 are separated by another insulating core 104. Each insulating core 102 and 104 is nominally 0.004 inch (0.102 mm) thick and may, e.g., comprise a type 4000-13 laminate manufactured by New England Laminating Company, Inc., Newburgh, N.Y., USA. A layer of solder mask 85 overlays the top surface of top layer 87.

The top layer 87 of the printed circuit board 106 comprises seventeen (17) pad-defined connections for FET drains, which may be characterized as defining laterally non-conductive regions, each drain pad 90 (two of which are shown in FIG. 11) being 0.012 inch (0.305 mm) in diameter. The top layer 87 also comprises seventeen (17) solder-mask-defined connections for FET sources, each also 0.012 inch (0.30 mm) in diameter. The locations of two connections are shown in FIG. 11 by circles 94. A 0.005 inch (0.127 mm) clearance region 92 separates the drain pads 90 from the remainder of the top layer 87. The solder mask layer 85 comprises seventeen (17) cleared-away regions above the circles 94 (two of which are shown in FIG. 11 as source clearance holes 86), each 0.012 inch (0.305 mm) in diameter, and seventeen (17) cleared-away regions, each 0.017 inch (0.432 mm) in diameter, conforming to the locations of the circumferences of the clearance regions 92 (two of which are shown in FIG. 11 as drain clearance holes 88).

Seventeen hollow copper columns 97, 0.004 inch (0.102 mm) in diameter, connect the top layer 87 to the middle layer 89. Likewise, seventeen hollow copper columns 96, also 0.004 inch (0.102 mm) in diameter, connect the drain pads 90 on top layer 87 to drain pads 99 on the middle layer 89. A 0.005 inch (0.127 mm) clearance region 98 separates the drain pads 99 from the remainder of the middle layer 89. Seventeen copper columns 100, 0.010 inch (0.254 mm) in diameter, connect the seventeen (17) drain pads 99 on the middle layer 89 to the bottom layer 91.

In the printed circuit board arrangement of FIGS. 11 and 12, the top and middle layers 87 and 89 (exclusive of drain pads 90 and 99 and their associated clearance regions 92 and 98) and columns 97, form the source terminal of the MOSFET device 80. The bottom layer 91, with its associated columns 96 and 100 and pads 90 and 99, form the drain terminal. The aggregate resistance of such a construction, comprising the series resistance of the source and drain terminals, each terminal extending to 3 sides of the MOSFET, and including the fusible solder ball contacts on the MOSFET device 80, but not including any other portion of the MOSFET device, is approximately 200 micro-Ohm. This interconnect resistance is substantially lower than the interconnect resistance of interconnect structures, such as in FIG. 5. Terminating the MOSFET using all four of its sides can result in an interconnect resistance equal to or less than about 200 micro-Ohm; terminating the MOSFET using two of its sides can result in an interconnect resistance higher than about 200 micro-Ohm. In general, it is possible to achieve an aggregate interconnect resistance equal to or less than about 500 micro-Ohm for the structure shown in FIGS. 11 and 12, preferably equal to or less than about 300 micro-Ohm, and more preferably equal to or less than about 200 micro-Ohm.

The copper columns may be formed by the following process: a pattern of holes is etched into a first copper layer of a circuit board laminate (the laminate comprising first and second layers of copper on the two outer surfaces of a non-conductive core) to expose the surface of the non-conductive core at each etched location; a laser drills apertures at each etched location, the apertures extending through the core all the way to the inner surface of the second copper layer (the aperture will not typically go through the second copper layer owing to reflection of the laser beam by the copper); the inner surfaces of the apertures are plated up to form a hollow copper cylinder.

The substrate 106 of FIG. 12 may comprise two laminates, a first laminate comprising top layer 87, core 102, and first inner layer 89a, and a second laminate comprising bottom layer 91, core 104, and second inner layer 89b. Columns 96 can be formed by first etching a pattern of holes into top layer 87, the diameter of the holes conforming to the outer diameter of the columns 96; laser-drilling the core 102 at each hole location to form apertures having the diameter of columns 96, the apertures extending down to the inner surface 108 of first inner layer 89a; and plating the inside surfaces of the apertures to form columns 96. Each column comprises a hollow region 30a. Columns 100 are formed by an identical process, the columns extending through core 104 to the inside surface of inner layer 89b. The first and second laminates are then joined together to form substrate 106.

The particular embodiments discussed and depicted above are merely illustrative, and may be modified and reconfigured readily in accordance with the low loss, array interconnect architecture set forth herein. By way of non-limiting example, the alternating patterns described and depicted above may be altered to accommodate various types and configurations of interconnects. For instance, the checkerboard-like pattern shown in FIG. 2 may be altered such that the repeating cell includes more than five balls, such that the repeating cellular pattern is internally asymmetric about one or more axes, etc. Various types of interconnects may be used, including but not limited to metal solder, conductive epoxy, wires, or stud bumps. Multiple interconnect layers may be used to mount a die or other circuit on to the substrate. The substrate can be a ceramic plate, printed circuit board, or any other substrate adapted to interconnect a circuit element. The circuit mounted to the substrate can be disposed on a die, another printed circuit board, or any other suitable substrate. The circuit element need not be lateral or vertical power MOSFET device, but rather can be any device having patterns of interconnect elements requiring a low resistance substrate interconnect. The insulating and conductive layers may include only traces; alternately, the layers may substantially cover a surface area of the substrate. The conductive layers can be formed of any suitable conductive or semiconductive material, including copper, aluminum, polysilicon, and polysalide. The masks discussed herein may likewise be formed of any suitable insulating material, or they may be omitted entirely in certain embodiments. The conductive columns may be replaced with any suitable connector which spans, alone or in cooperation with other elements, the distance between the interconnect elements (such as solder balls) and a conductive layer. Any desired number of multiple-conductive-layer substrate or substrate sections may be used, which may be advantageous to further reduce Rds-on. Any number of conductive layers may have common termination.

A number of embodiments of the invention have been described. Nevertheless, it will be understood that various modifications may be made without departing from the spirit and scope of the invention. Accordingly, other embodiments are within the scope of the following claims.

What is claimed is:

1. An apparatus comprising a device connected to a circuit board by interconnect elements, said interconnect elements comprising a ball-grid array having at least three rows and three columns of interconnect elements, said circuit board comprising
   a first conductive layer directly connected to a first plurality of said interconnect elements to form a first termination, said first plurality of interconnect elements forming a first repeating pattern; and
   a second conductive layer connected to a second plurality of said interconnect elements to form a second termination, said second plurality of interconnect elements forming a second repeating pattern alternating with said first repeating pattern;
   said first conductive layer defining a first array of laterally non-conductive apertures at locations conforming to the locations of said second plurality of interconnect elements, said first conductive layer otherwise being substantially continuous in an area under said device,
   said second conductive layer separated from said first conductive layer by insulating material,
   wherein said second conductive layer is connected to said second plurality of interconnect elements at locations within said laterally non-conductive apertures by conductive connectors which pass through said insulating material, said second conductive layer being substantially continuous in an area encompassing said conductive connectors.

2. The apparatus of claim 1, wherein current flows into said first termination along at least three sides of a periphery of the ball-grid array.

3. The apparatus of claim 1, wherein said device is a power MOSFET die.

4. The apparatus of claim 3, wherein said die comprises lateral MOSFET devices.

5. The apparatus of claim 1, wherein interconnect elements in said first and second pluralities neighbor one another and wherein the distance between interconnect elements in said first plurality is greater than the distance between neighboring interconnect elements in said first and second pluralities.

6. The apparatus of claim 5, wherein the distance between interconnect elements in said first plurality is about $\sqrt{2}$ greater than the distance between neighboring interconnect elements in said first and second pluralities.

7. The apparatus of claim 4, wherein said first plurality of interconnect elements comprises drain contacts.

8. The apparatus of claim 7, wherein said second plurality of interconnect elements comprises source contacts.

9. The apparatus of claim 1 wherein said interconnect elements comprise solder balls.

10. The apparatus of claim 1 wherein said interconnect elements comprise conductive epoxy.

11. The apparatus of claim 1 wherein said conductive layers comprise copper.

12. The apparatus of claim 11, wherein each termination comprises three sides along the periphery of the ball-grid array.

13. The apparatus of claim 1, wherein the aggregate resistance between the interconnect elements of the device and the terminations is equal to or less than 500 micro-Ohm.

14. The apparatus of claim 1, wherein the aggregate resistance between the interconnect elements of the device and the terminations is equal to or less than 250 micro-Ohm.

15. The apparatus of claim 1, wherein the conductive connectors are vias.

16. The apparatus of claim 1, wherein said layers are conductive etches which form conductive patterns that cover a majority of a surface area of the circuit board.

17. The apparatus of claim 1, wherein said first repeating pattern and said second repeating pattern comprise complimentary checkerboard patterns.

18. The apparatus of claim 1, wherein said conductive connectors are substantially aligned with said second plurality of said interconnect elements.

19. An apparatus comprising a substrate for receiving a die having solder balls that comprise a ball-grid array having at least three rows and three columns, said substrate comprising:
   a first conductive layer adapted to be connected to a first plurality of said solder balls to form a first termination, said first plurality of solder balls forming a first repeating pattern; and
   a second conductive layer adapted to be connected to a second plurality of said solder balls to form a second termination, said second plurality of solder balls forming a second repeating pattern;
   said first conductive layer defining a first array of laterally non-conductive apertures at locations conforming to the locations of said second plurality of solder balls, said first conductive layer otherwise being substantially continuous in an area under said first plurality of said solder balls, said second conductive layer separated from said first conductive layer by insulating material, wherein said second conductive layer is adapted to be connected to said second plurality of solder balls at locations within said laterally non-conductive apertures by vias that pass through said insulating material, said vias being substantially aligned with said second plurality of said solder balls, said second conductive layer being substantially continuous in an area under said vias.

20. The apparatus of claim 19, wherein current flows into said first termination along at least three sides of a periphery of the array.

21. The apparatus of claim 19, further comprising a power MOSFET die.

22. The apparatus of claim 21, wherein said die comprises lateral MOSFET devices.

23. The apparatus of claim 19, wherein the solder balls in said first and second pluralities neighbor one another and wherein the distance between the solder balls in said first plurality is greater than the distance between neighboring solder balls in said first and second pluralities.

24. The apparatus of claim 23, wherein the distance between the solder balls in said first plurality is about $\sqrt{2}$ greater than the distance between neighboring solder balls in said first and second pluralities.

25. The apparatus of claim 22, wherein said first plurality of solder balls comprises drain contacts.

26. The apparatus of claim 25, wherein said second plurality of solder balls comprises source contacts.

27. The apparatus of claims 19, wherein said substrate is a printed circuit board.

28. The apparatus of claim 27, wherein said die is mounted onto a first surface of said printed circuit board and said first surface comprises said first conductive layer.

29. The apparatus of claim 28, wherein said insulating material comprises a layer having a top and a bottom surface, said first conductive layer being located on said top surface and said second conductive layer being located on said bottom surface.

30. The apparatus of claim 19, wherein said conductive layers comprise copper.

31. The apparatus of claim 30, wherein each termination comprises three sides along the periphery of the array.

32. The apparatus of claim 19, wherein the aggregate resistance between the die and the terminations is equal to or less than 500 micro-Ohm.

33. The apparatus of claim 19, wherein the aggregate resistance between the die and the terminations is equal to or less than 250 micro-Ohm.

34. The apparatus of claim 19, wherein said layers are conductive etches which form conductive patterns that cover a substantial fraction of a surface area of the substrate.

35. The apparatus of claim 19, wherein said first repeating pattern and said second repeating patterns substantially comprise complimentary checkerboard patterns.

\* \* \* \* \*

UNITED STATES PATENT AND TRADEMARK OFFICE
CERTIFICATE OF CORRECTION

| | | |
|---|---|---|
| PATENT NO. | : 7,038,917 B2 | Page 1 of 1 |
| APPLICATION NO. | : 10/331032 | |
| DATED | : May 2, 2006 | |
| INVENTOR(S) | : Patrizio Vinciarelli, Charles I. McCauley and Paul V. Starenas | |

It is certified that error appears in the above-identified patent and that said Letters Patent is hereby corrected as shown below:

Column 9, line 48, after "comprising" please insert --:--;

Column 10, line 48, after second occurrence of "pattern" please insert --substantially--;

Column 12, line 3, please delete "claims" and insert --claim--therefor.

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,038,917 B2 | Page 1 of 1 |
| APPLICATION NO. | : 10/331032 | |
| DATED | : May 2, 2006 | |
| INVENTOR(S) | : Vinciarelli et al. | |

It is certified that error appears in the above-identified patent and that said Letters Patent is hereby corrected as shown below:

On the title page (*) Notice, change "302" to --236--.

Signed and Sealed this

Third Day of April, 2007

JON W. DUDAS
*Director of the United States Patent and Trademark Office*